United States Patent [19]

Bajwa et al.

[11] Patent Number: 4,785,428
[45] Date of Patent: Nov. 15, 1988

[54] PROGRAMMABLE MEMORY ARRAY CONTROL SIGNALS

[75] Inventors: Atiq Bajwa, Portland; Robert Duzett, Hillsboro; M. Vittal Kini, Portland; Kent Mason, Portland; Mark S. Myers, Portland; Sunil Shenoy, Beaverton County, all of Oreg.

[73] Assignee: Intel Corporation, Santa Clara, Calif.

[21] Appl. No.: 63,468

[22] Filed: Jun. 18, 1987

[51] Int. Cl.⁴ .............................................. G11C 13/00
[52] U.S. Cl. .................................... 365/233; 365/189
[58] Field of Search ............... 365/182, 233, 185, 186, 365/189, 191, 193, 194, 230

[56] References Cited

U.S. PATENT DOCUMENTS 4,494,223  1/1985  Reddy et al. .

Primary Examiner—Terrell W. Fears
Attorney, Agent, or Firm—Owen L. Lamb

[57] ABSTRACT

The waveform of a strobe type signal (70) is specified by two bit strings (72, 74) stored in the RAM (20), one bit string (72) denoting when the strobe is to be reset and the other (74) denoting when the strobe is to be set. The bit positions in the bit strings correspond with clock cycles (76) taken for a DRAM memory access. The bit positions are written by means of addressable registers (71) corresponding to rows (e.g. 80–87) of the RAM. A one bit in the set bit string (72) causes the signal (70) to be asserted in the corresponding clock cycle of the request. A one bit in the reset bit string causes the signal (70) to be de-asserted in the corresponding clock cycle of the request. The set and reset times are fine-tuned to a fraction of a cycle by providing a multi-bit fractional cycle index field (78) to accompany each bit string. If a two bit quarter cycle index (QCI) field is used, the boundaries of the quarter cycles are numbered from 0 to 3. 0 coincides with the first quarter cycle after the leading edge of a clock cycle and 3 coincides with the clock cycle boundary. The one bit in the set or reset bit string denotes the cycle in which a transition is to take place, while the quarter cycle index field encoding denotes the precise quarter of the cycle in which the transition takes place.

10 Claims, 5 Drawing Sheets

```
CYCLE              1     2     3     4     5
QUARTER CYCLE    3 0 1 2 3 0 1 2 3 0 1 2 3 0 1 2 3 0 1 2 3
CLOCK
```

TIMING SEQUENCE    0    0    1    0    0

QCI                    GENERATED TRANSITION

00

01
SET
RESET
DRIVE

10
SET
RESET
DRIVE

11
SET
RESET
DRIVE

SET
RESET
DRIVE

PROGRAMMABLE MEMORY ARRAY CONTROL SIGNALS

BACKGROUND OF THE INVENTION

1. Technical Field

The present invention relates to data processing systems, and more particularly to apparatus for programming the signal lines between a memory control unit and a memory array.

2. Background Art

Present day dynamic random access memories (eg. DRAMs) are controlled by memory control units (MCUs). These MCUs match the speed of different arrays by providing different fixed speeds at which the arrays can be operated, with the appropriate array control signal timings specified for each speed. Existing memory control units provide only two or three fixed timings of differing durations, and lack the flexibility of being able to accommodate DRAM control signal timings that vary from manufacturer to manufacturer.

Furthermore, providing two or three fixed timings of differing durations results in poor memory performance in many cases because the fineness of the signal timing adjustment is too coarse. It is desirable to be able to fine tune signal transitions to a fraction of a memory cycle.

It is also desirable to have a memory control unit that will generate any pattern of control signal timings to provide a range of timing controls for DRAM operations.

Because the pattern of control signal timings is used for DRAM control, there are some special requirements which are needed to meet high-performance timings. Instead of dealing with these as many special cases, it is desirable to integrate them as much as possible into the memory control unit. This reduces random logic and reduces design complexity.

It is an object of this invention to provide a memory array timing that is programmable, flexible, allows fine tuning to a fraction of a memory cycle, and is not overly complex.

SUMMARY OF THE INVENTION

Briefly, the above object is accomplished in accordance with the invention by providing an apparatus for programming the signal lines between a memory control unit and a memory array. The apparatus includes a program RAM, divided into a number (m) of timing sequences wherein timing transitions are defined by the presence of a bit in the sequence. The RAM further includes therein a programmable fractional-cycle index register for storing fractional-cycle indexes, each index corresponding to one of the timing transitions specified in the RAM. Each of the indexes comprises a number (k) of bits, the encoding thereof specifying the particular fractional division of a cycle in which the timing transition is to occur. A sequence control sequences the array through a complete access by selecting rows of the RAM. A signal MUX selects a number of memory array control lines from the RAM in response to the type of operation signalled to by a central sequencing logic.

The invention has the advantage that the user can draw a timing diagram for the memory array and then transfer that diagram as a program into the program RAM. Since the resolution between signal edges can be a fraction of a clock cycle, the technique allows fine tuning of the program to obtain the optimal sequencing of the memory array. This is an improvement over existing DRAM controllers which only provide two or three fixed timing options among which a user must choose.

The invention has the advantage that control signal timings can be changed to match any number of existing arrays and new arrays that become available.

DESCRIPTION OF THE DRAWINGS

The foregoings and other objects, features, and advantages of the invention will be apparent from the following more particular description of the preferred embodiments of the invention as illustrated in the accompanying drawings, wherein:

FIG. 5 is a generic timing sequence showing programmed transitions for different fractional-cycle index values for a given timing sequence bit string; and, FIG. 6 is a representation of the programmable sequence registers a sequence program encoded therein.

DESCRIPTION

Figure 1:
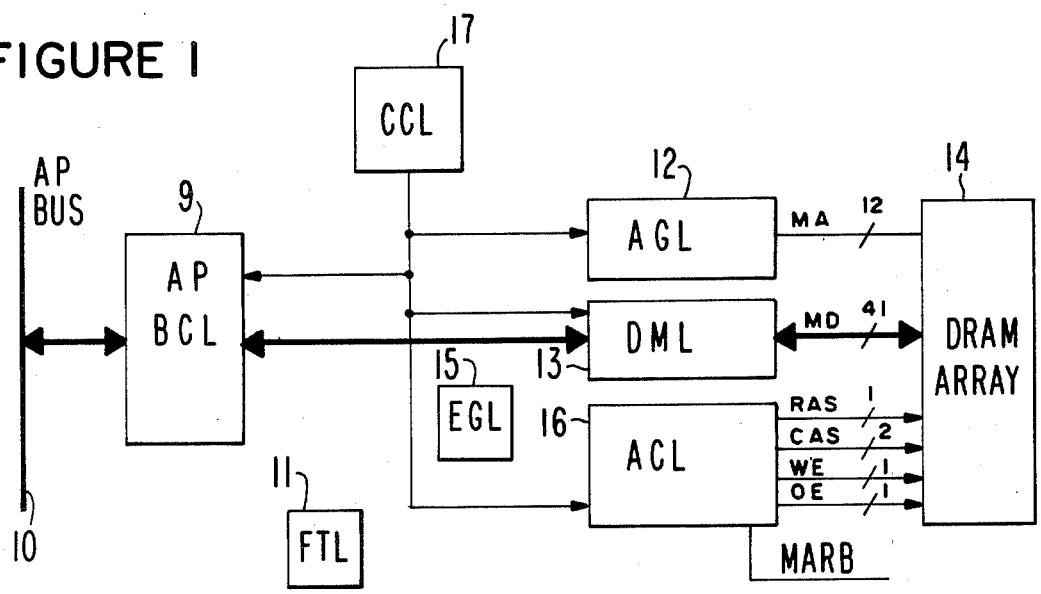
FIG. 1 is a functional block diagram illustrating each of the major components of the memory control unit in which the present invention is embodied.

Refer to FIG. 1 which is a block diagram of a memory control unit (MCU) in which the present invention is embodied. The MCU is made up of the following major blocks: the AP Bus Control Logic (AP BCL-9) which interfaces the MCU with the external AP bus (10); the Fault Tolerant Logic (FTL-11) which provides the MCU with error reporting capabilities; the Address Generation Logic (AGL-12) which takes the address from the AP Bus and generates the physical array row and column addresses; the Data Manipulation Logic (DML-13) which releases data to and accepts data from the DRAM array (14) based on timing sequences programmed into the MCU; and ECC Generation Logic (EGL-15) which generates error correcting code on the data passing through the MCU; the Array Control Logic (ACL-16) which provides the programmable timings; and the Central Sequencing Logic (CSL-17) which coordinates all of the functions performed by the other logic units described above. These logic units are driven by a clock having a two non-overlapping clock phase design such as the clock used in the Intel 80286 and Intel 80386. Four clocks, PH1, PH1I, PH2, PH2I, are distributed on the chip. PH1 and PH2 are non-overlapping clocks with equal duty cycles. PH1I and PH2I are the PMOS analogs to PH1 and PH2 and are exact inversions of PH1 and PH2 respectively.

Figure 2:
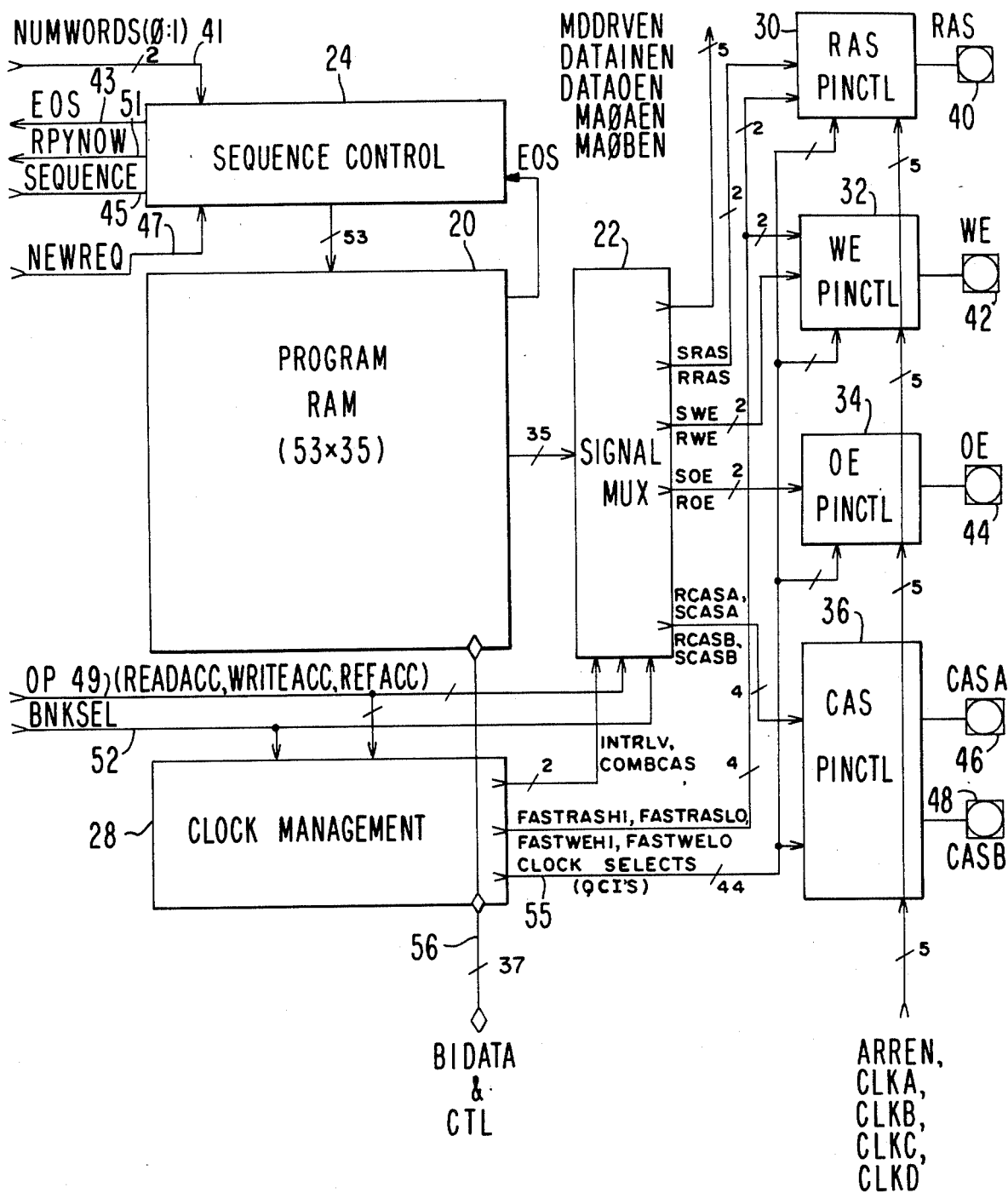
FIG. 2 is a more detailed block diagram of the array control logic (16) shown in FIG. 1.

The Array Control Logic (ACL-16) is shown in more detail in FIG. 2. The ACL directly controls the sequencing of activity on the bus between the MCU and the DRAM array (14). The main function of the ACL is the control of the programmable timings. Given the number of words and the type of operation, the ACL directs the Array Bus using the programmable timings until the access is finished.

The waveform of a drive type signal is specified by one bit string stored in the RAM (20). The waveform of a strobe type signal is specified by two bit strings stored in the RAM (20), one bit string denoting when the strobe is to be set and the other bit string denoting when the strobe is to be reset. A one bit in the set bit string will indicate that the signal is to be asserted in the corresponding clock cycle of the request. A one bit in the reset bit string will indicate that the signal is to be de-asserted in the corresponding clock cycle of the request. Fine tuning of the set and reset to a fraction of a cycle is accomplished by providing a multi-bit fractional cycle index field to accompany each bit string. In the description that follows, a two-bit quarter cycle index (QCI) field is used. The boundaries of the quarter cycles are numbered from 0 to 3, where 0 coincides with the first quarter cycle after the leading edge of a clock cycle and 3 coincides with the clock cycle boundary. The one bit in the set or reset bit string denotes the cycle in which a transition is to take place, whilst the quarter cycle index field encoding denotes the precise quarter of the cycle that the transition takes place.

It will be understood by those skilled in the art that a zero bit in the set or reset bit string may also be used to denote the cycle in which a transition is to take place. Also, setting a bit in the bit stream will be understood to include setting a one or zero, asserting the pin to a high voltage or a low voltage.

Furthermore, this specification and claims use quarter cycle indexes as an example only, it being understood by those skilled in the art that any fraction of a cycle may be used by providing more than two bits of encoding. For example, three bits in the fractional cycle index field will result in the ability to divide a cycle in eighths. In that case, the boundaries of the cycles would be numbered from 0 to 7, where 0 coincides with the first eighth cycle after the leading edge of a clock cycle and 7 coincides with the clock cycle boundary.

FIG. 5 is a generic timing sequence showing programmed transitions for different quarter-cycle index (QCI) values with the same set and reset timing sequence bit strings. This illustrates how different fractional-cycles can be specified for a particular bit string. Drive type signals are not set and reset and therefore require only one bit string, for example for enabling data or addresses onto the pins.

The ACL (10) of FIG. 2 is comprised of the following logic units. The sequence control (24); the Program RAM (20); the clock management (28); the signal mux (22); the RAS buffer (30); the WE buffer (32); the OE buffer (34); and the CAS buffer (36).

Sequence Control (24)

The sequence control (24) is essentially a counter which shifts across a portion of the 53 rows of the RAM. Each row corresponds to a time slice (one clock cycle) of all the interface signals (35 columns of the program RAM) to be programmed. The signals to the sequence control are NEWREQ (47), NUMWORDS (41), EOS (43), SEQUENCE (45), and RPYNOW (51). NEWREQ is a signal from the CSL (17) that indicates that a request has been accepted by this MCU and the ACL may sequence it when it is ready to do so. NUMWORDS is comprised of two lines which are encoded to specify the initial number of words (1-4) for the access. SEQUENCE indicates that the sequence control is currently processing a request and EOS indicates that the sequence control has completed the previous access. RPYNOW indicates the clock cycle in which the transmission of the AP bus read reply packet may begin.

Signal Mux (22)

The signal mux (22) is controlled by the OP signal input (49) which is encoded to specify whether the operation is a READ, WRITE, or REFRESH. The OP signal may be unary encoded using 3 bits or binary encoded using 2 bits. The signal mux (22) selects the appropriate read, the write, and the refresh input/output signals (columns) of the RAM word. It also switches the logical FIRSTCAS, SECONDCAS, COL1DRV and COL2DRV between the actual controls of CASA, CASB, and memory addresses, depending upon the interleaving and the bank select (BANK-SEL-52). The intent is that all the switching takes place in the signal mux. Signals out of the signal mux go directly to the respective pin controls (30, 32, 34, 36).

DRAM Array Interface

The DRAM array (14) may be composed of, for example, the TC 51100 P 1Mb DRAM manufactured by Toshiba Corporation.

Referring to FIG. 2, the interface lines between the ACL and the DRAM (14) are:

| RAS   | Row array select (40)      |
|-------|----------------------------|
| CAS A | Column array select 0 (46) |
| CAS B | Column array select 1 (48) |
| WE    | Write enable (42)          |
| OE    | Output enable (44)         |

Referring to FIG. 1, the interface lines between the AGL (12) and the DRAM (14) are:

| MA | Memory address |
|----|----------------|
| MD | Memory data    |

The following lines to the DRAM array pin controls (30-36) are programmable for Reads/Writes, and Refreshes:

Reads
| | |
|---|---|
| SETFIRSTCAS | RESETFIRSTCAS |
| SETSECONDCAS | RESETSECONDCAS |
| SETFIRSTOE | RESETFIRSTOE |
| SETSECONDOE | RESETSECONDOE |
| SETRAS | RESETRAS |
| COL1DRV | |
| COL2DRV | |
| DATAIN | (program for beginning of cycle on which the data is strobed into the MCU) |
| RPYNOW | |
| EOS | |

Writes
| | |
|---|---|
| SETFIRSTCAS | RESETFIRSTCAS |
| SETSECONDCAS | RESETSECONDAS |
| SETRAS | RESETRAS |
| SETWE | RESETWE |
| COL1DRV | |
| COL2DRV | |
| DATAOUT | (program for cycle on which the data is driven out of the MCU) |
| MDDRVN | (enable output pin controls for data |
| EOS | |

Refreshes:
| | |
|---|---|
| SETOE | RESETOE |
| SETCAS | RESETCAS |
| SETRAS | RESETRAS |

-continued

EOS

This amounts to 35 programmable bits per time slice. The meaning of the above bits will be understood by those skilled in the art from DRAM specification sheets, except for EOS which is explained below.

End of Sequence (EOS) Bit

The read and write patterns for each word count (1, 2, 3, and 4 words) are separately specified in the RAM. The number of words in the RAM for this will be approximately 7 for 1 word, 11 for 2 words, 15 for 3 words, and 19 for 4 words to make a total of about 52 words. The first programmable vector is common to all the word counts. But the subsequent vectors are different for each word count. There is one additional bit, EOS (end of sequence) in the read, write, and refresh vectors for each time slice. EOS must be programmed to a one in the last time slice of each word count pattern. It indicates that after this time slice, the programmable timings will all go to their inactive states (all the sets and resets will be zero, none of the address or data bits will be driven, etc.)

The signal mux (22) switches between read/write/refresh vectors, turns off of all drives at the end of the sequence (as indicated by EOS), and performs the logical-to-actual CAS and column-switching for interleaving. For internal timing reasons, the first RAM word corresponding to the first cycle of encoding for the four word-count programs must be the same. When a sequence is not in progress, the sequence control (24) reads this first RAM word, which is common to all word counts. This forms the first time slice vector. By the time it needs to read the second time slice vector (on the PH1 following that on which the request information was on the BI data bus), the word count information is there and the correct second RAM word is reading out. On subsequent cycles, the sequence control (24) acts like a counter, reading out consecutively ordered words until the end of the sequence when it goes back to reading the common word.

MDDRVEN

When the MCU is not doing a write access, the data pins are kept in a high-impedance state so as to avoid contention with the memory array. During write accesses, the data pins need to be brought out of the high-impedance state before data is driven out onto them. The transitions in and out of the high-impedance state are controlled by the MDDRVEN timing sequence: for each cycle in which the data pins need to be driven to a high or low value, the MDDRVEN bit in the corresponding time-slice must be programmed to be a one. Conversely, MDDRVEN must be programmed to be a zero in all time-slices where the data pins need to be in the high-impedance state. Since the data pins are only driven by the MCU during write accesses, the MDDRVEN bit exists only in the write vector for a time-slice.

RPYNOW

Depending on the programming of the array control signals and the speed of the DRAMs of which the array is constructed, read data may not arrive from the array on every clock cycle. On the other hand, once the transmission of the reply packet containing the read data begins on the AP bus (10), then the AP bus timing requires the transmission of a data word every clock cycle. Read data coming from the array is queued in the MCU and transmission of the AP bus reply packet may begin as soon as sufficient read data has accumulated in the queue. However, because of the programmability of the timing sequence, the MCU cannot know which clock cycle is the appropriate one to begin the transmission of the AP bus read reply packet.

The RPYNOW timing sequence must be programmed by the user to indicate to the MCU the clock cycle in which the transmission of the AP bus read reply packet may begin. The user programs a single one bit in this sequence to indicate this clock cycle.

Clock Management (28) QCI Registers

Figure 3:
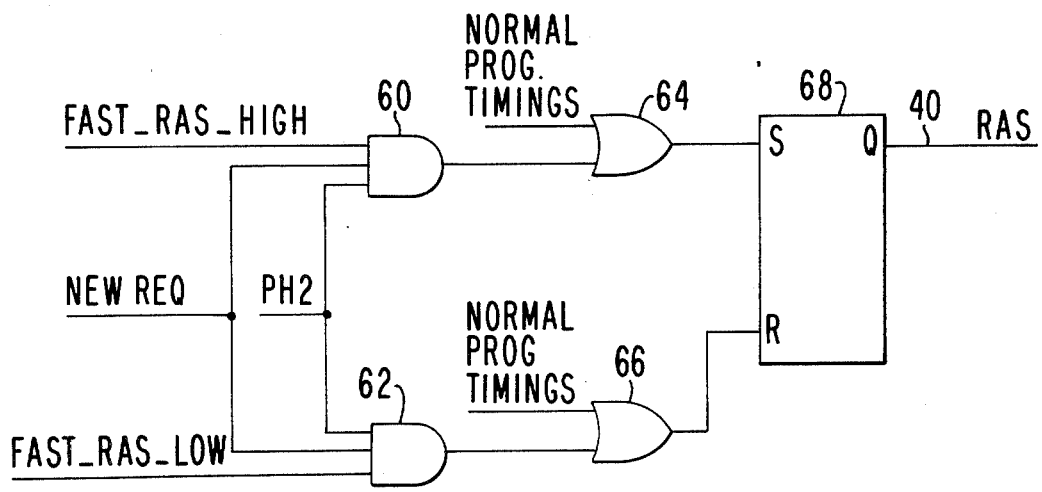
FIG. 3 is a diagram of a fast Row Address Strobe (RAS) transition circuit.

The clock management (28) contains the fast RAS circuit shown in detail in FIG. 3 and the quarter cycle index clock select circuitry. The clock selects (55) drive each of the pin control blocks (30-36) to select the appropriate quarter cycle in accordance with the programmed entry in the corresponding QCI register.

Signal Pin Controls (30-36)

The signal pins that are affected by the programmable timings are RAS (40), CASA (46), CASB (48), OE (44), WE (42), the column address lines, the data lines driven by the AGL (12) during writes, and the loading of the input data during reads by the DML (11). While most of these signals are exclusively controlled by the programmable timings, there are some that are also controlled by other means.

The pin control logic includes logic which in response to the clock selects (55) selects the appropriate quarter cycle which is used to gate the set, reset, or drive type signal.

The signal OE is muxed with BNKSEL. The way this is achieved is that OE is set or reset by the AGL (13), depending on the BNKSEL, at the time the row address goes out. This AGL's set/reset is operative only when NEWREQ (47) is active. After NEWREQ goes away, which is basically in PH2 of the cycle following the BIDATA bus (56) request cycle, the OE pin (44) is controlled by the programmable timings and the QCI indices just like CAS, etc.

Fast RAS Transition

One constraint is that the leading edge of RAS be able to begin as early as 0.5 cycles before the programmable sequence. This is dictated by the basic layout of the program RAM (20). The information about the kind of access is not available until the PH2 of the cycle on which the request is on the BIDATA bus (56). This is the same PH2 in the middle of which RAS must become active.

The programming for RAS and WE are similar that of the other signals. Once the programmable timings begin, it is the responsibility of the programmable timing to control these signals until the end of the sequence. In particular, the programmable timings have to deactivate these signals at the end of the sequence. However, at the beginning of the sequence, these signals need to transition faster than the time instant at which the programmable timings begin. This is achieved by the logic shown in FIG. 3 which is contained within the clock management block (28). If the FAST_RAS_HIGH bit is set (input to AND-60), then on the beginning of any read or write access, RAS is set in the middle of the clock phase 2 (PH2 in which NEWREQ is asserted.

Figure 4:
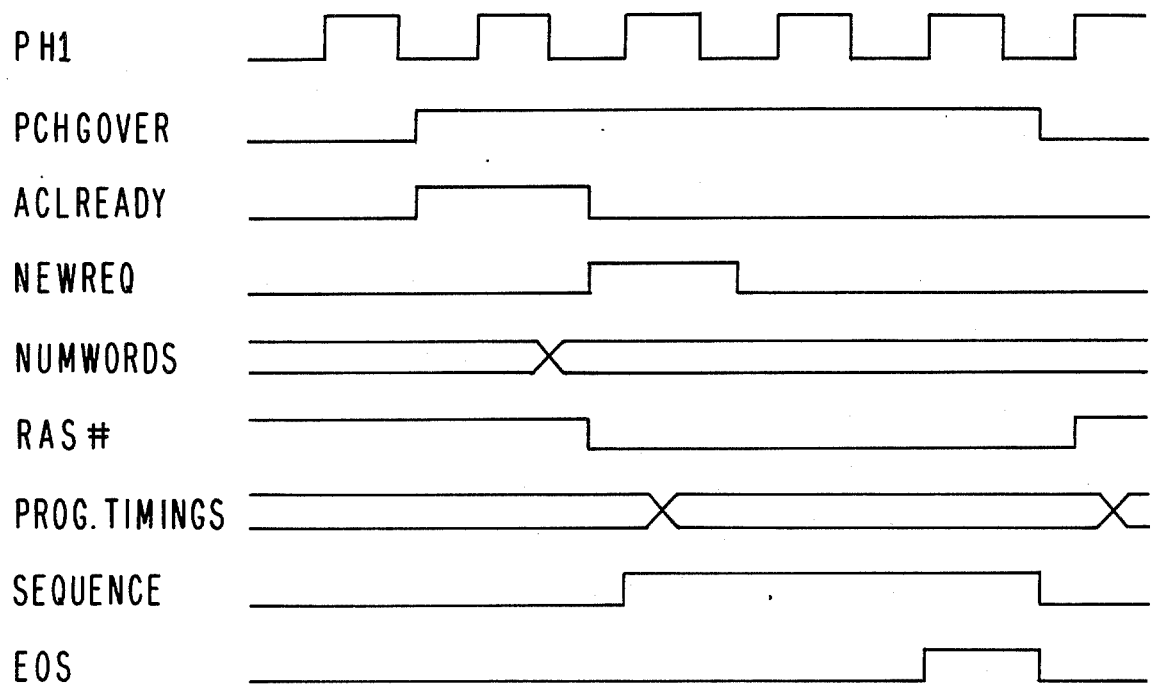
FIG. 4 is a timing diagram illustrating the fast RAS transition circuit shown in FIG. 3 within an overall timing diagram of the array control logic.

If the FAST_RAS_LOW bit is set (input to AND-62), then RAS is reset in the middle of the clock phase 2 (PH2) for any read or write access. The fast RAS inputs are or'd with the normal programmable timings in OR (64) and OR (66). The RAS buffer (68) is set with the signal from OR (64) and reset with the signal from OR (66). The output from RAS buffer (68) drives the RAS pad (40). The timing for this fast RAS line is shown in FIG. 4.

A similar circuit (not shown) is used for write enable: FAST_WE_HIGH and FAST_$WE$_LOW setting or re-setting only on write accesses.

RAS PRECHARGE

There is a minimum RAS precharge time. This is specified by a 3-bit counter. The position of the one in this register indicates what the minimum RAS precharge time is. Refer to the timing diagram of FIG. 4. The counting of the precharge cycles is enabled when SEQUENCE goes inactive, since this coincides approximately with the trailing edge of RAS. When the count expires, a signal called PCHGOVER is set. This signal is reset when SEQUENCE goes high again indicating that another sequence has begun. At this time the counter is reloaded.

Program RAM (20)

Figure 6:
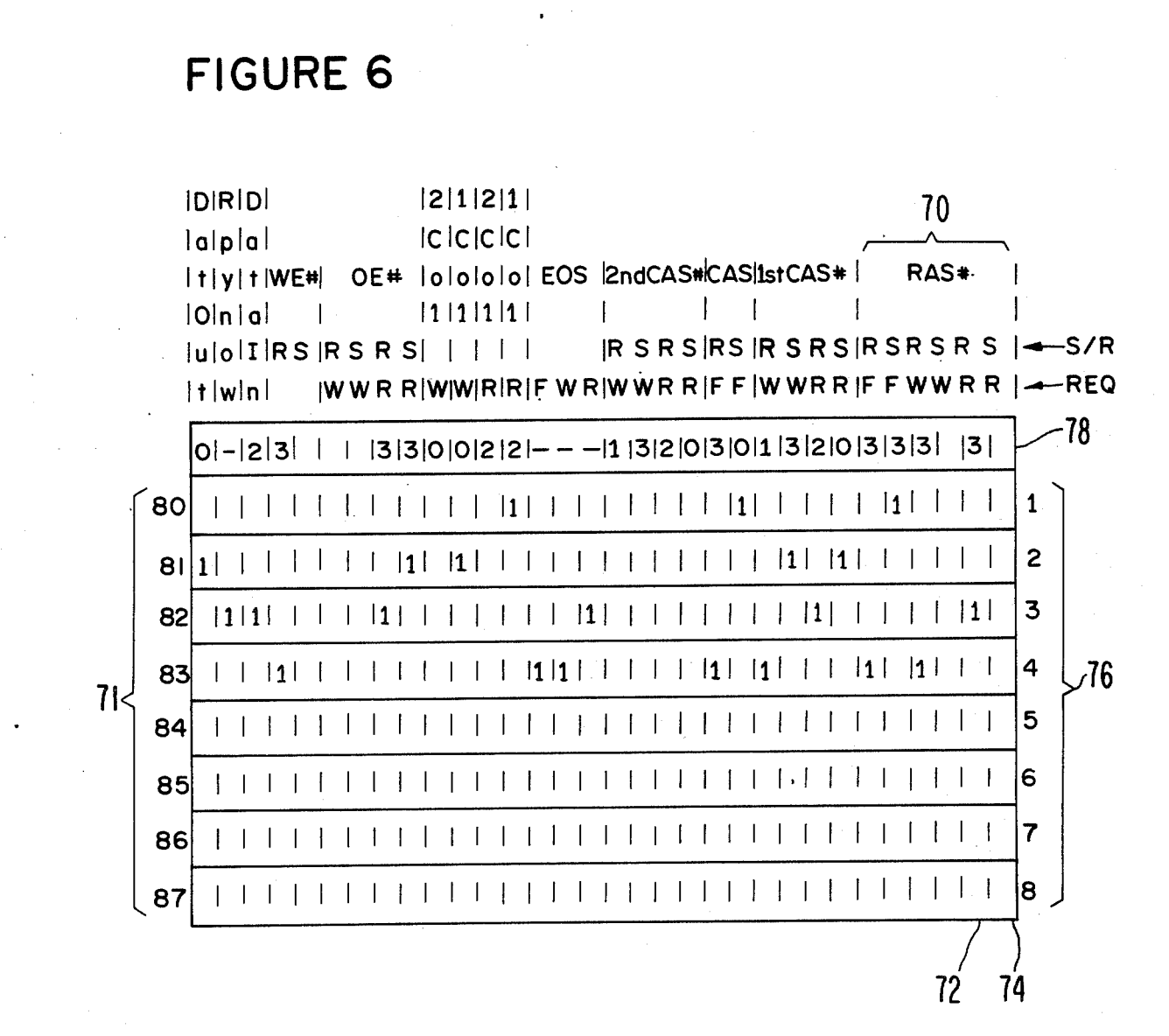

The programmable timing sequences of the MCU are stored in the program RAM array (20). The 35 columns of this array correspond to the individual timing sequences, one or more of which may apply to a given control signal or group of signals. Thus, the number of rows of this array (53) is equal to the sum of the maximum lengths of the four wordcount programs. Refer to FIG. 6. The first row (register 80) of this array corresponds to Clock Cycle 1 of the access or, equivalently, Bit Index 1 of each timing sequence bitstring programmed in the RAM. Similarly, the last row (register 87) corresponds to Clock Cycle 8 or, equivalently, Bit Index 8 of each timing sequence bitstring. Each row of this array is addressable externally as a Programmable sequence Register within the MCU using Interagent Communication (IAC).

Quarter Cycle Index (QCI) Registers

Refer to FIG. 6. Associated with the program RAM array is a set of programmable registers (78) of two-bit fields, the Quarter Cycle Index Registers (QCI Registers). Alternatively the registers may be unary encoded three-bit fields. The QCI registers may be a portion of the RAM itself or may be separate programmable registers located in the clcok management logic block (28). The Quarter Cycle Indices (QCI) are provided one each for the read (R), write (W), and refresh (F) sets. Each set contains 28 bits. This consists of 2-bit indices for sets and resets of CASA, CASB, RAS, WE, and OE and a 2-bit index for COL1DRV, COL2DRV, DATAOUT, and DATAIN.

As shown in FIG. 6 each column of the program RAM corresponds to one of the programming bit sequences. Each row (80 . . . 87) of the RAM is a word, and corresponds to a clock cycle (1 . . . 8). Therefore, Register 80 corresponds to clock Cycle 1, Register 81 corresponds to Clock Cycle 2, etc. For any given sequence in a column, such as RAS (70), a one bit is set in the appropriate row (71) to provide for the desired signal transition, set (s) or reset (R) in a given cycle (76). These set and reset sequences are provided for each of the refresh (F), write (W), and read (R) operations. Along with each column, there is the two-bit quarter cycle index field which is stored in the quarter cycle index register (78), described above. The two-bit field provides for four quarter cycles. One of three QCI registers are selected and driven out to the pads using the operation select lines OP (0:1).

Each field in the QCI Register has a one-to-one correspondence to a column in the program RAM array and corresponds to the QCI for the timing sequence bit string that is specified in that column of the array.

In a preferred embodiment of the invention, there are four entry points into the program RAM, only one of which is shown in the drawings for clarity. These four parts of RAM are programmed by the user to provide the timing sequences for 1-word, 2-word, 3-word, and 4-word accesses, respectively. For internal timing integrity, the programmable sequence register that represents Cycle 1 (i.e., the first row of the RAM) is shared amongst all four of parts of the RAM. As far as programming the arrays is concerned, this first register is available as an address only in the 1-word access program part of the RAM array. The programming in that register is implicitly used for Cycle 1 of the 2-word, 3-word, and 4-word timing sequences.

Only the 4-word accesses potentially require the full 20 cycle timing sequence length. Therefore, the program RAM arrays for 1word, 2-word, and 3-word accesses have, respectively, 8, 11, and 15 rows (i.e., the maximum sequence lengths are 8, 12 and 16 clock cycles, respectively). The number of clock cycles for the 2-word and 3-word program RAMS include the clock cycle from the shared first word of the 1-word timing sequence. The program RAM array for the 4-word access sequences is composed of 19 rows giving a maximum 4-word sequence length of 20 cycles.

The four portions of the program RAM are each 35 bits wide (i.e., each programmable sequence register corresponding to a row of the RAM is a 35-bit register). This means that 35 timing sequences are represented by each of the four portions of the RAM array. Of these timing sequences, 30 are grouped to apply to Read, Write, and Refresh operations. The remaining five are "housekeeping" sequences that must be provided by the programmer to indicate when a sequence is complete and when a reply may be started on the AP Bus in response to a Read request. A generic MCU Programmable sequence Register is described below; each row of each of the four program RAM arrays has this format:

| GENERIC PROGRAMMABLE SEQUENCE REGISTER |
| --- |
| 3 |
| 4 |
| SSSSSSSSSSSSSSSSSSSSSSSSSSSSSSSSSSS    Cycle N |

As shown in FIG. 6, each row (register 80, register 81, . . . ) of the program RAM Array is an addressable register represented by the Generic Programmable sequence Register depicted above. Each such row or register represents a time slice out of an access sequence. The register shown above is the Nth time slice out of the access. Each bit column of the Generic Programmable sequence Register belongs to a specific timing sequence bitstring and is the Nth bit (Nth clock cycle) in the signal sequence that has been programmed into that timing sequence bitstring. Enumerated below are the names of the timing sequence bitstrings that are represented in the register.

| Bit 0 | RAS SET sequence for Reads |
| Bit 1 | RAS RESET sequence for Reads |
| Bit 2 | RAS SET sequence for Writes |
| Bit 3 | RAS RESET sequence for Writes |
| Bit 4 | RAS SET sequence for Refresh |
| Bit 5 | RAS RESET sequence for Refresh |
| Bit 6 | First CAS SET sequence for Reads |
| Bit 7 | First CAS RESET sequence for Reads |
| Bit 8 | First CAS SET sequence for Writes |
| Bit 9 | First CAS RESET sequence for Writes |
| Bit 10 | CAS SET sequence for Refresh |
| Bit 11 | CAS RESET sequence for Refresh |
| Bit 12 | Second CAS SET sequence for Reads |
| Bit 13 | Second CAS RESET sequence for Reads |
| Bit 14 | Second CAS SET sequence for Writes |
| Bit 15 | Second CAS RESET sequence for Writes |
| Bit 16 | End-of-sequence indication for Reads (No associated QCI for this sequence) |
| Bit 17 | End-of-sequence indication for Writes (No associated QCI for this sequence) |
| Bit 18 | End-of-sequence indication for Refresh (No associated QCI for this sequence) |
| Bit 19 | Bank 0 Column Address DRIVE sequence for Reads |
| Bit 20 | Bank 1 Column Address DRIVE sequence for Reads |
| Bit 21 | Bank 0 Column Address DRIVE sequence for Writes |
| Bit 22 | Bank 1 Column Address DRIVE sequence for Writes |
| Bit 23 | OE1 SET sequence for Reads |
| Bit 24 | OE2 RESET sequence for Reads |
| Bit 25 | OE1 SET sequence for Reads |
| Bit 26 | OE2 RESET sequence for Reads |
| Bit 27 | WE SET sequence (applicable only during Writes) |
| Bit 28 | WE RESET sequence (applicable only during Writes) |
| Bit 29 | Data-In Latch timing sequence |
| Bit 30 | Send-Reply timing sequence (no associated QCI with this sequence) |
| Bit 31 | Data-Out DRIVE sequence |

Since there are 28 timing sequences that require QCIs, a total of 28 two-bit fields are required in the QCI Register. In the preferred embodiment of the invention, these 28 QCIs are distributed amongst three QCI Registers, namely, the Read QCI Register, the Write QCI Register, and the Refresh QCI Register. In other words, the QCIs are grouped in registers according as they apply to the Read, the Write, or the Refresh operation. The QCI Registers are described below:

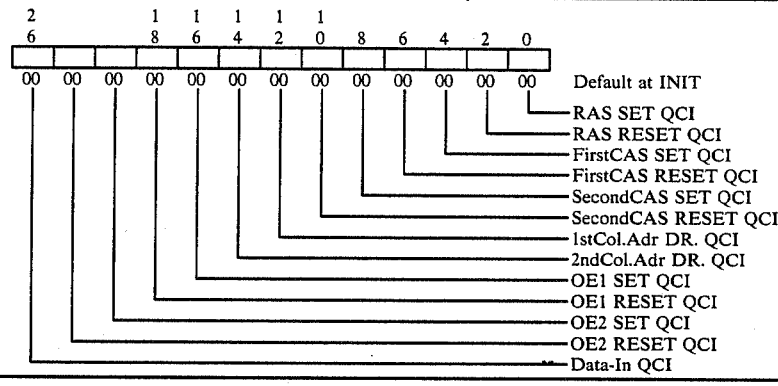

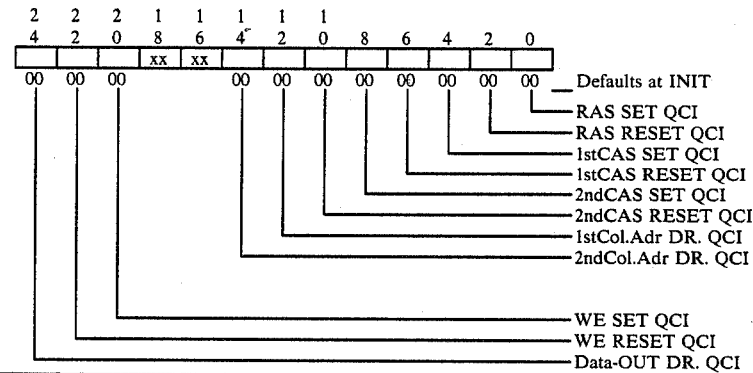

All of the fields in this register provide quarter-cycle indexes for the various Write access timing sequences mentioned in the diagram.

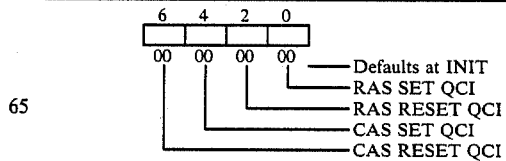

All of the fields in this register provide quarter-cycle indexes for the various Refresh access timing sequences mentioned in the diagram.

Referring now to FIG. 5, an example of transition programming is shown. For a given sequence, if the quarter cycle index (QCI) is changed, the quarter cycle upon which the transition occurs will accordingly be changed. The timing sequence in this example remains the same, that is, the generated transition occurs on the third cycle of the sequence. Up to a maximum of 20 cycles can be programmed, which corresponds to the maximum access length for a four word access for the slowest DRAM supported (120 nano-second DRAM at 20 MHz).

Refer now to FIG. 6 which is an example of a sequence program for one word operations. For clarity, not all signals that can be programmed are shown in this example. In the embodiment disclosed herein, signals are asserted low, so a set operation stands for a transition from high to low. The polarity itself is programmable for each control signal. This is handled by the clock management logic block (28). The signal lines shown from left to right are Dataout, Reply Now (RPYNOW), Datain; Write Enable (WE#), Output Enable (OE#), second column address (2COL), first column address (1COL), End Of Sequence (EOS), second Column Address Strobe (2nd CAS#), Column Address Strobe (CAS), First Column Address Strobe (1st CAS#), Row Address Strobe (RAS#). The S/R line indicates whether the column is a set or a reset sequence. The REQ line indicates whether the column refers to reads (R), writes (W), or refreshes (F). The QCI line indicates the respective QCIs that have to be programmed in the read, write, and refresh QCI register fields corresponding to those columns.

Register address 80 corresponds to clock cycle 1. In Cycle 1, on quarter-cycle three, the RAS signal (RAS#) is set (S) for REFRESH (F). The reset (R) happens on quartercycle three in cycle 4 (corresponding to register 83). Thus, by just setting one bit and the associated quarter cycle index, the cycle and the quarter cycle within the cycle is specified.

While the invention has been particularly shown and described with reference to preferred embodiments thereof, it will be understood by those skilled in the art that the foregoing and other changes in form and detail may be made therein without departing from the scope of the invention.

What is claimed is:

1. Apparatus for programming a plurality of array control signal lines (40–48) between a memory control unit and a memory array (14) comprising:
   a program RAM (20) comprised of memory elements arranged in m columns and n rows;
   the m columns of said program RAM (20) being a number (m) of timing sequences wherein a timing transition is definable by the presence of a bit in said timing sequence;
   the n rows of said program RAM being a number (n) of addressable registers, there being one register for each cycle of programmed access to said memory array (14);
   a programmable fractional cycle index register (28) for storing a plurality of fractional cycle indexes, one index for said timing transition defined in said RAM, each of said indexes comprising a number (k) of bits, the encoding thereof specifying the particular division of a cycle of said memory array in which said timing transition is defined;
   sequence control means (24) connected to said RAM (20) for sequencing said RAM through said memory array cycles by sequentially selecting said rows of said RAM; and,
   signal MUX means (22), connected to outputs of said RAM (20) for selecting and causing a transition in one of said number array control lines (40–48) in response to said bit in said timing sequence for the selected array control line.

2. The apparatus of claim 1 wherein:
   a first one of said m columns of said RAM is a programmable set sequence for a particular strobe signal timing upon the condition that there is a bit in said first column;
   a second one of said m columns of said RAM is a programmable reset sequence for said particular strobe signal timing upon the condition that there is a bit in said second column.

3. The apparatus of claim 1 wherein:
   the boundaries of the fractional cycles specified by said programmable fractional cycle index register (QCI) are numbered from 0 to p−1, where 0 coincides with the first fractional cycle after the leading edge of a clock cycle and p−1 coincides with the clock cycle boundary.

4. The apparatus of claim 2 wherein:
   the boundaries of the fractional cycles specified by said programmable fractional cycle index register (QCI) are numbered from 0 to p−1, where 0 coincides with the first fractional cycle after the leading edge of a clock cycle and p−1 coincides with the clock cycle boundary.

5. The apparatus of claim 1 wherein:
   said program RAM (20) is divided into j parts;
   said j parts being programmed to provide the timing sequences for 1-word, 2-word, 3-word, . . . j-word accesses, respectively.

6. The apparatus of claim 2 wherein:
   said program RAM (20) is divided into j parts;
   said j parts being programmed to provide the timing sequences for 1-word, 2-word, 3-word, . . . j-word accesses, respectively.

7. The apparatus of claim 3 wherein:
   said program RAM (20) is divided into j parts;
   said j parts being programmed to provide the timing sequences for 1-word, 2-word, 3-word, . . . j-word accesses, respectively.

8. The apparatus of claim 4 wherein:
   said program RAM (20) is divided into j parts;
   said j parts being programmed to provide the timing sequences for 1-word, 2-word, 3-word, . . . j-word accesses, respectively.

9. The apparatus of claim 1 wherein:
   at least one of said m columns of said program RAM (20) is an end of sequence (EOS) timing sequence wherein a timing transition defined by the presence of a bit in said EOS timing sequence indicates to said sequence control means (24) connected to said RAM (20) that said number of timing sequences have ended.

10. The apparatus of claim 5 wherein:
   1, 2, 3, . . . j ones of said m columns of said program RAM (20) are end of sequence (EOS) timing sequences wherein a timing transition defined by the presence of a bit in each respective EOS timing sequence indicates to said sequence control means (24) connected to said RAM (20) that said timing sequences for 1-word, 2-word, 3-word, . . . j-word accesses sequences have ended.

* * * * *